(12) United States Patent
Reddy et al.

(10) Patent No.: US 9,647,536 B2
(45) Date of Patent: May 9, 2017

(54) HIGH VOLTAGE GENERATION USING LOW VOLTAGE DEVICES

(71) Applicant: SanDisk Technologies LLC, Plano, TX (US)

(72) Inventors: Gooty Sukumar Reddy, Anantapur (IN); Potnuru Venkata Pradeep Kumar, Visakhapatnam (IN); Sridhar Yadala, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/811,314

(22) Filed: Jul. 28, 2015

(65) Prior Publication Data

US 2017/0033682 A1 Feb. 2, 2017

(51) Int. Cl.
*G11C 5/14* (2006.01)
*H02M 3/07* (2006.01)

(52) U.S. Cl.
CPC ............... *H02M 3/07* (2013.01); *G11C 5/14* (2013.01); *G11C 5/145* (2013.01)

(58) Field of Classification Search
CPC ................................ G11C 5/14; G11C 7/12
USPC ............................................ 365/189.09, 226
See application file for complete search history.

(56) References Cited

U.S. PATENT DOCUMENTS

| 3,697,860 | A | 10/1972 | Baker |
|---|---|---|---|
| 4,271,461 | A | 6/1981 | Hoffmann et al. |
| 4,511,811 | A | 4/1985 | Gupta |
| 4,583,157 | A | 4/1986 | Kirsch et al. |
| 4,621,315 | A | 11/1986 | Vaughn et al. |
| 4,636,748 | A | 1/1987 | Latham, II |
| 4,736,121 | A | 4/1988 | Cini et al. |
| 4,888,738 | A | 12/1989 | Wong et al. |
| 5,140,182 | A | 8/1992 | Ichimura |
| 5,168,174 | A | 12/1992 | Naso et al. |
| 5,175,706 | A | 12/1992 | Edme |
| 5,263,000 | A | 11/1993 | Buskirk et al. |
| 5,335,198 | A | 8/1994 | Buskirk et al. |
| 5,392,205 | A | 2/1995 | Zavaleta |
| 5,432,469 | A | 7/1995 | Tedrow et al. |
| 5,436,587 | A | 7/1995 | Cernea |
| 5,483,434 | A | 1/1996 | Seesink |
| 5,508,971 | A | 4/1996 | Cernea |
| 5,521,547 | A | 5/1996 | Tsukada |

(Continued)

FOREIGN PATENT DOCUMENTS

| CN | 101764518 A | 6/2010 |
|---|---|---|
| CN | 101882928 A | 11/2010 |

(Continued)

OTHER PUBLICATIONS

Ang et al., "An On-Chip Voltage Regulator Using Switched Decoupling Capacitors," Feb. 2000 IEEE International Solid-State Circuits Conference, 2 pages.

(Continued)

*Primary Examiner* — Michael Tran
(74) *Attorney, Agent, or Firm* — Stoel Rives LLP (57) ABSTRACT

A charge pump design suitable for generating high voltages employs multiple low voltage capacitors and low voltage transfer switches, with a limited number of high voltage devices. This is designed such that during a first clock phase, capacitors are each connected between an input voltage and ground and, during a second clock phase all the capacitors are connected in series to generate the required voltage. Both the switches (PMOS) and as well the capacitors are realized as low voltage devices. The ability to use low voltage devices can significantly reduce the area and also a reduction in current consumption relative to the usual high voltage charge pumps which uses high voltage devices.

22 Claims, 3 Drawing Sheets

(56) References Cited

U.S. PATENT DOCUMENTS

| | | |
|---|---|---|
| 5,539,351 A | 7/1996 | Gilsdorf et al. |
| 5,553,030 A | 9/1996 | Tedrow et al. |
| 5,563,779 A | 10/1996 | Cave et al. |
| 5,563,825 A | 10/1996 | Cernea et al. |
| 5,568,424 A | 10/1996 | Cernea et al. |
| 5,570,315 A | 10/1996 | Tanaka et al. |
| 5,592,420 A | 1/1997 | Cernea et al. |
| 5,596,532 A | 1/1997 | Cernea et al. |
| 5,602,794 A | 2/1997 | Javanifard et al. |
| 5,621,685 A | 4/1997 | Cernea et al. |
| 5,625,544 A | 4/1997 | Kowshik |
| 5,635,776 A | 6/1997 | Imi |
| 5,644,534 A | 7/1997 | Soejima |
| 5,693,570 A | 12/1997 | Cernea et al. |
| 5,712,778 A | 1/1998 | Moon |
| 5,732,039 A | 3/1998 | Javanifard et al. |
| 5,734,286 A | 3/1998 | Takeyama et al. |
| 5,734,290 A | 3/1998 | Chang et al. |
| 5,767,735 A | 6/1998 | Javanifard et al. |
| 5,781,473 A | 7/1998 | Javanifard et al. |
| 5,801,987 A | 9/1998 | Dinh |
| 5,812,017 A | 9/1998 | Golla et al. |
| 5,818,766 A | 10/1998 | Song |
| 5,828,596 A | 10/1998 | Takata et al. |
| 5,903,495 A | 5/1999 | Takeuchi et al. |
| 5,943,226 A | 8/1999 | Kim |
| 5,945,870 A | 8/1999 | Chu et al. |
| 5,969,565 A | 10/1999 | Naganawa |
| 5,969,988 A | 10/1999 | Tanzawa et al. |
| 5,973,546 A | 10/1999 | Le et al. |
| 5,978,283 A | 11/1999 | Hsu et al. |
| 5,982,222 A | 11/1999 | Kyung |
| 6,008,690 A | 12/1999 | Takeshima et al. |
| 6,011,440 A | 1/2000 | Bell et al. |
| 6,016,073 A | 1/2000 | Ghilardelli et al. |
| 6,018,264 A | 1/2000 | Jin et al. |
| 6,023,187 A | 2/2000 | Camacho et al. |
| 6,026,002 A | 2/2000 | Viehmann |
| 6,100,557 A | 8/2000 | Hung et al. |
| 6,104,225 A | 8/2000 | Taguchi et al. |
| 6,107,862 A | 8/2000 | Mukainakano et al. |
| 6,134,145 A | 10/2000 | Wong |
| 6,147,566 A | 11/2000 | Pizzuto et al. |
| 6,151,229 A | 11/2000 | Taub et al. |
| 6,154,088 A | 11/2000 | Chevallier et al. |
| 6,157,242 A | 12/2000 | Fukui et al. |
| 6,188,590 B1 | 2/2001 | Chang et al. |
| 6,198,645 B1 | 3/2001 | Kotowski et al. |
| 6,208,198 B1 | 3/2001 | Lee |
| 6,249,445 B1 | 6/2001 | Sugasawa |
| 6,249,898 B1 | 6/2001 | Koh et al. |
| 6,272,029 B1 | 8/2001 | Hirose |
| 6,275,096 B1 | 8/2001 | Hsu et al. |
| 6,278,294 B1 | 8/2001 | Taniguchi |
| 6,285,622 B1 | 9/2001 | Haraguchi et al. |
| 6,288,601 B1 | 9/2001 | Tomishima |
| 6,297,687 B1 | 10/2001 | Sugimura |
| 6,307,425 B1 | 10/2001 | Chevallier et al. |
| 6,314,025 B1 | 11/2001 | Wong |
| 6,320,428 B1 | 11/2001 | Atsumi et al. |
| 6,320,796 B1 | 11/2001 | Voo |
| 6,320,797 B1 | 11/2001 | Liu |
| 6,329,869 B1 | 12/2001 | Matano |
| 6,333,873 B1 | 12/2001 | Kumanoya et al. |
| 6,341,087 B1 | 1/2002 | Kunikiyo |
| 6,344,959 B1 | 2/2002 | Milazzo |
| 6,344,984 B1 | 2/2002 | Miyazaki |
| 6,356,062 B1 | 3/2002 | Elmhurst et al. |
| 6,356,499 B1 | 3/2002 | Banba et al. |
| 6,359,798 B1 | 3/2002 | Han et al. |
| 6,369,642 B1 | 4/2002 | Zeng |
| 6,370,075 B1 | 4/2002 | Haeberli et al. |
| 6,385,107 B1 | 5/2002 | Bedarida et al. |
| 6,400,202 B1 | 6/2002 | Fifield et al. |
| 6,404,274 B1 | 6/2002 | Hosono et al. |
| 6,411,157 B1 | 6/2002 | Hsu et al. |
| 6,424,570 B1 | 7/2002 | Le et al. |
| 6,445,243 B2 | 9/2002 | Myono |
| 6,456,154 B2 | 9/2002 | Sugimura |
| 6,456,170 B1 | 9/2002 | Segawa et al. |
| 6,476,666 B1 | 11/2002 | Palusa et al. |
| 6,486,728 B2 | 11/2002 | Kleveland |
| 6,501,325 B1 | 12/2002 | Meng |
| 6,518,830 B2 | 2/2003 | Gariboldi et al. |
| 6,522,191 B1 | 2/2003 | Cha |
| 6,525,614 B2 | 2/2003 | Tanimoto |
| 6,525,949 B1 | 2/2003 | Johnson et al. |
| 6,531,792 B2 | 3/2003 | Oshio |
| 6,538,930 B2 | 3/2003 | Ishii et al. |
| 6,545,529 B2 | 4/2003 | Kim |
| 6,556,465 B2 | 4/2003 | Haeberli et al. |
| 6,577,535 B2 | 6/2003 | Pasternak |
| 6,606,267 B2 | 8/2003 | Wong |
| 6,661,682 B2 | 12/2003 | Kim et al. |
| 6,703,891 B2 | 3/2004 | Tanaka et al. |
| 6,724,241 B1 | 4/2004 | Bedarida et al. |
| 6,734,718 B1 | 5/2004 | Pan |
| 6,737,887 B2 | 5/2004 | Forbes et al. |
| 6,737,907 B2 | 5/2004 | Hsu et al. |
| 6,760,262 B2 | 7/2004 | Haeberli et al. |
| 6,762,640 B2 | 7/2004 | Katsuhisa |
| 6,781,440 B2 | 8/2004 | Huang |
| 6,798,274 B2 | 9/2004 | Tanimoto |
| 6,819,162 B2 | 11/2004 | Pelliconi |
| 6,834,001 B2 | 12/2004 | Myono |
| 6,841,981 B2 | 1/2005 | Smith et al. |
| 6,859,091 B1 | 2/2005 | Nicholson |
| 6,878,981 B2 | 4/2005 | Eshel |
| 6,891,764 B2 | 5/2005 | Li |
| 6,894,554 B2 | 5/2005 | Ito |
| 6,922,096 B2 | 7/2005 | Cernea |
| 6,927,441 B2 | 8/2005 | Pappalardo et al. |
| 6,933,768 B2 | 8/2005 | Hasumann |
| 6,944,058 B2 | 9/2005 | Wong |
| 6,954,386 B2 | 10/2005 | Narui et al. |
| 6,975,135 B1 | 12/2005 | Bui |
| 6,985,397 B2 | 1/2006 | Tokui |
| 6,990,031 B2 | 1/2006 | Hashimoto et al. |
| 6,995,603 B2 | 2/2006 | Chen et al. |
| 6,999,327 B2 | 2/2006 | Smith et al. |
| 7,002,381 B1 | 2/2006 | Chung |
| 7,023,260 B2 | 4/2006 | Thorp et al. |
| 7,030,683 B2 | 4/2006 | Pan et al. |
| 7,046,076 B2 | 5/2006 | Daga et al. |
| 7,092,263 B2 | 8/2006 | Chang |
| 7,113,023 B2 | 9/2006 | Cernea |
| 7,116,154 B2 | 10/2006 | Guo |
| 7,116,155 B2 | 10/2006 | Pan |
| 7,119,624 B2 | 10/2006 | Gomez |
| 7,120,051 B2 | 10/2006 | Gorobets et al. |
| 7,123,078 B2 | 10/2006 | Seo |
| 7,129,538 B2 | 10/2006 | Lee et al. |
| 7,129,759 B2 | 10/2006 | Fukami |
| 7,135,910 B2 | 11/2006 | Cernea |
| 7,135,911 B2 | 11/2006 | Imamiya |
| 7,135,934 B2 | 11/2006 | Sanchez et al. |
| 7,145,382 B2 | 12/2006 | Ker et al. |
| 7,180,794 B2 | 2/2007 | Matsue |
| 7,205,682 B2 | 4/2007 | Kuramori |
| 7,208,996 B2 | 4/2007 | Suzuki et al. |
| 7,215,179 B2 | 5/2007 | Yamazoe et al. |
| 7,224,591 B2 | 5/2007 | Kaishita et al. |
| 7,227,780 B2 | 6/2007 | Komori et al. |
| 7,239,192 B2 | 7/2007 | Tailliet |
| 7,253,675 B2 | 8/2007 | Aksin et al. |
| 7,253,676 B2 | 8/2007 | Fukuda et al. |
| 7,259,612 B2 | 8/2007 | Saether |
| 7,276,960 B2 | 10/2007 | Peschke |
| 7,279,957 B2 | 10/2007 | Yen |
| 7,345,335 B2 | 3/2008 | Watanabe |
| 7,348,829 B2 | 3/2008 | Choy et al. |
| 7,368,979 B2 | 5/2008 | Govindu et al. |
| 7,382,176 B2 | 6/2008 | Ayres et al. |
| 7,391,630 B2 | 6/2008 | Acatrinei |

(56) References Cited

U.S. PATENT DOCUMENTS

| | | |
|---|---|---|
| 7,397,677 B1 | 7/2008 | Collins et al. |
| 7,436,241 B2 | 10/2008 | Chen et al. |
| 7,466,188 B2 | 12/2008 | Fifield |
| 7,468,628 B2 | 12/2008 | Im et al. |
| 7,495,471 B2 | 2/2009 | Perisetty |
| 7,495,500 B2 | 2/2009 | Al-Shamma et al. |
| 7,515,488 B2 | 4/2009 | Thorp et al. |
| 7,521,978 B2 | 4/2009 | Kim et al. |
| 7,554,311 B2 | 6/2009 | Pan |
| 7,558,129 B2 | 7/2009 | Thorp et al. |
| 7,579,902 B2 | 8/2009 | Frulio et al. |
| 7,579,903 B2 | 8/2009 | Oku |
| 7,586,362 B2 | 9/2009 | Pan et al. |
| 7,602,233 B2 | 10/2009 | Pietri et al. |
| 7,667,529 B2 | 2/2010 | Consuelo et al. |
| 7,671,572 B2 | 3/2010 | Chung |
| 7,683,700 B2 | 3/2010 | Huynh et al. |
| 7,696,812 B2 | 4/2010 | Al-Shamma et al. |
| 7,702,043 B2 | 4/2010 | Smith et al. |
| 7,741,898 B2 | 6/2010 | Hsu |
| 7,742,358 B2 | 6/2010 | Nakai et al. |
| 7,772,914 B2 | 8/2010 | Jung |
| 7,795,952 B2 | 9/2010 | Lui et al. |
| 7,830,203 B2 | 11/2010 | Chang et al. |
| 7,928,796 B2 | 4/2011 | Namekawa |
| 7,944,277 B1 | 5/2011 | Sinitsky et al. |
| 7,944,279 B1 | 5/2011 | Waffaoui |
| 7,948,301 B2 | 5/2011 | Cook et al. |
| 7,956,673 B2 | 6/2011 | Pan |
| 7,956,675 B2 | 6/2011 | Saitoh et al. |
| 7,969,235 B2 | 6/2011 | Pan |
| 7,973,592 B2 | 7/2011 | Pan |
| 7,986,160 B2 | 7/2011 | Hoang et al. |
| 8,040,184 B2 | 10/2011 | Tschuiya |
| 8,044,705 B2 | 10/2011 | Nandi et al. |
| 8,093,953 B2 | 1/2012 | Pierdomenico et al. |
| 8,159,091 B2 | 4/2012 | Yeates |
| 8,193,853 B2 | 6/2012 | Hsieh et al. |
| 8,242,834 B2 | 8/2012 | Chuang et al. |
| 8,258,857 B2 | 9/2012 | Adkins et al. |
| 8,294,509 B2 | 10/2012 | Pan et al. |
| 8,339,183 B2 | 12/2012 | Htoo et al. |
| 8,339,185 B2 | 12/2012 | Cazzaniga et al. |
| 8,358,150 B1 | 1/2013 | Snyder et al. |
| 8,395,440 B2 | 3/2013 | Sandhu et al. |
| 8,405,450 B2 | 3/2013 | Ucciardello et al. |
| 8,493,040 B2 | 7/2013 | Gunther et al. |
| 8,537,593 B2 | 9/2013 | Huynh et al. |
| 8,604,868 B2 | 12/2013 | Ucciardello et al. |
| 8,643,358 B2 | 2/2014 | Yoon |
| 8,699,247 B2 | 4/2014 | Nguyen et al. |
| 8,710,908 B2 | 4/2014 | Lin et al. |
| 8,717,699 B1 | 5/2014 | Ferris |
| 8,817,553 B2 | 8/2014 | Yu et al. |
| 2002/0008566 A1 | 1/2002 | Taito et al. |
| 2002/0014908 A1 | 2/2002 | Lauterbach |
| 2002/0075063 A1 | 6/2002 | Hwang |
| 2002/0075706 A1 | 6/2002 | Foss et al. |
| 2002/0101744 A1 | 8/2002 | DeMone |
| 2002/0130701 A1 | 9/2002 | Kleveland |
| 2002/0130704 A1 | 9/2002 | Myono et al. |
| 2002/0140463 A1 | 10/2002 | Cheung |
| 2002/0163376 A1 | 11/2002 | Pappalardo et al. |
| 2003/0128560 A1 | 7/2003 | Saiki et al. |
| 2003/0214346 A1 | 11/2003 | Pelliconi |
| 2003/0231566 A1 | 12/2003 | Smith et al. |
| 2004/0046603 A1 | 3/2004 | Bedarida et al. |
| 2004/0263238 A1 | 12/2004 | Thorp et al. |
| 2005/0024125 A1 | 2/2005 | McNitt et al. |
| 2005/0030088 A1 | 2/2005 | Cernea |
| 2005/0093614 A1 | 5/2005 | Lee |
| 2005/0104572 A1 | 5/2005 | Smith et al. |
| 2005/0146375 A1 | 7/2005 | Ker et al. |
| 2005/0162145 A1 | 7/2005 | Smith et al. |
| 2005/0195017 A1 | 9/2005 | Chen et al. |
| 2005/0237103 A1 | 10/2005 | Cernea |
| 2005/0248386 A1 | 11/2005 | Pan et al. |
| 2006/0098505 A1 | 5/2006 | Cho et al. |
| 2006/0114053 A1 | 6/2006 | Sohara et al. |
| 2006/0119393 A1 | 6/2006 | Hua et al. |
| 2006/0202828 A1 | 9/2006 | Shanks et al. |
| 2006/0244518 A1 | 11/2006 | Byeon et al. |
| 2006/0250177 A1 | 11/2006 | Thorp |
| 2007/0001745 A1 | 1/2007 | Yen |
| 2007/0053216 A1 | 3/2007 | Alenin |
| 2007/0069805 A1 | 3/2007 | Choi et al. |
| 2007/0126494 A1 | 6/2007 | Pan |
| 2007/0139099 A1 | 6/2007 | Pan |
| 2007/0139100 A1 | 6/2007 | Pan |
| 2007/0152738 A1 | 7/2007 | Stopel et al. |
| 2007/0210853 A1 | 9/2007 | Maejima |
| 2007/0211502 A1 | 9/2007 | Komiya |
| 2007/0222498 A1 | 9/2007 | Choy et al. |
| 2007/0229149 A1 | 10/2007 | Pan et al. |
| 2008/0012627 A1 | 1/2008 | Kato |
| 2008/0024096 A1 | 1/2008 | Pan |
| 2008/0024198 A1 | 1/2008 | Bitonti et al. |
| 2008/0042731 A1 | 2/2008 | Daga et al. |
| 2008/0068067 A1 | 3/2008 | Govindu et al. |
| 2008/0111604 A1 | 5/2008 | Boerstler et al. |
| 2008/0116963 A1 | 5/2008 | Jung |
| 2008/0136500 A1 | 6/2008 | Frulio et al. |
| 2008/0157731 A1 | 7/2008 | Pan |
| 2008/0157852 A1 | 7/2008 | Pan |
| 2008/0157859 A1 | 7/2008 | Pan |
| 2008/0174360 A1 | 7/2008 | Hsu |
| 2008/0186081 A1 | 8/2008 | Yamahira et al. |
| 2008/0218134 A1 | 9/2008 | Kawakami et al. |
| 2008/0239802 A1 | 10/2008 | Thorp et al. |
| 2008/0239856 A1 | 10/2008 | Thorp et al. |
| 2008/0278222 A1 | 11/2008 | Conte et al. |
| 2008/0307342 A1 | 12/2008 | Furches et al. |
| 2009/0033306 A1 | 2/2009 | Tanzawa |
| 2009/0051413 A1 | 2/2009 | Chu et al. |
| 2009/0058506 A1 | 3/2009 | Nandi et al. |
| 2009/0058507 A1 | 3/2009 | Nandi et al. |
| 2009/0063918 A1 | 3/2009 | Chen et al. |
| 2009/0091366 A1 | 4/2009 | Baek et al. |
| 2009/0121780 A1 | 5/2009 | Chen et al. |
| 2009/0121782 A1 | 5/2009 | Oyama et al. |
| 2009/0153230 A1 | 6/2009 | Pan et al. |
| 2009/0153231 A1 | 6/2009 | Pan et al. |
| 2009/0153232 A1 | 6/2009 | Fort et al. |
| 2009/0167418 A1 | 7/2009 | Raghavan |
| 2009/0174441 A1 | 7/2009 | Gebara et al. |
| 2009/0184697 A1 | 7/2009 | Park |
| 2009/0219077 A1 | 9/2009 | Pietri et al. |
| 2009/0219079 A1 | 9/2009 | Bergler et al. |
| 2009/0296488 A1 | 12/2009 | Nguyen et al. |
| 2009/0315598 A1 | 12/2009 | Namekawa |
| 2009/0315616 A1 | 12/2009 | Nguyen et al. |
| 2009/0322413 A1 | 12/2009 | Huynh et al. |
| 2010/0019832 A1 | 1/2010 | Pan |
| 2010/0033232 A1 | 2/2010 | Pan |
| 2010/0074034 A1 | 3/2010 | Cazzaniga |
| 2010/0085794 A1 | 4/2010 | Chen et al. |
| 2010/0118625 A1 | 5/2010 | Matano |
| 2010/0127761 A1 | 5/2010 | Matano |
| 2010/0157706 A1* | 6/2010 | Cho ................ G11C 7/12 365/203 |
| 2010/0244935 A1 | 9/2010 | Kim et al. |
| 2010/0283549 A1 | 11/2010 | Wang |
| 2010/0302877 A1 | 12/2010 | Bang |
| 2011/0026329 A1 | 2/2011 | Wada |
| 2011/0068857 A1 | 3/2011 | Ucciardello et al. |
| 2011/0133820 A1 | 6/2011 | Pan |
| 2011/0133821 A1 | 6/2011 | Honda |
| 2011/0148509 A1 | 6/2011 | Pan et al. |
| 2011/0156803 A1 | 6/2011 | Yap et al. |
| 2011/0169557 A1 | 7/2011 | Yamahira et al. |
| 2011/0176370 A1 | 7/2011 | Izumi et al. |
| 2011/0254615 A1 | 10/2011 | Raghunathan et al. |
| 2012/0230071 A1 | 9/2012 | Kaneda |
| 2012/0274394 A1 | 11/2012 | Chan |

(56) References Cited

U.S. PATENT DOCUMENTS

| | | |
|---|---|---|
| 2013/0162229 A1 | 6/2013 | Chan |
| 2013/0181521 A1 | 7/2013 | Khlat |
| 2013/0221938 A1 | 8/2013 | Conte et al. |
| 2014/0084936 A1 | 3/2014 | Pan et al. |
| 2014/0085985 A1 | 3/2014 | Pan et al. |
| 2014/0375293 A1 | 12/2014 | Pan et al. |

FOREIGN PATENT DOCUMENTS

| | | |
|---|---|---|
| DE | 10 2007 026290 A1 | 7/2008 |
| EP | 0 382 929 A2 | 8/1990 |
| EP | 0 780 515 A1 | 6/1997 |
| EP | 1 362 320 A2 | 11/2003 |
| EP | 1 925 062 A2 | 5/2008 |
| JP | 2007-020268 A | 1/2007 |
| JP | 101902059 A | 12/2010 |
| WO | WO-0106336 A1 | 1/2001 |
| WO | WO-02065380 A2 | 8/2002 |
| WO | WO-2006132757 A2 | 12/2006 |
| WO | WO-2007026289 A1 | 3/2007 |

OTHER PUBLICATIONS

Pan, "Charge Pump Circuit Design," McGraw-Hill, 2006, 26 pages.
Pylarinos et al., "Charge Pumps: An Overview," Department of Electrical and Computer Engineering, University of Toronto, Proceedings of Symposium May 2003, 7 pages.

\* cited by examiner

HIGH VOLTAGE GENERATION USING LOW VOLTAGE DEVICES

BACKGROUND

This following pertains generally to the field of charge pumps and more particularly to high voltage charge pumps for integrated circuits.

Figure 1A:
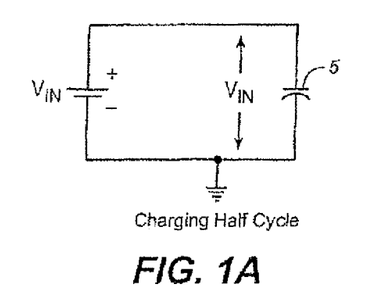
FIG. 1A is a simplified circuit diagram of the charging half cycle in a generic charge pump.
Figure 1B:
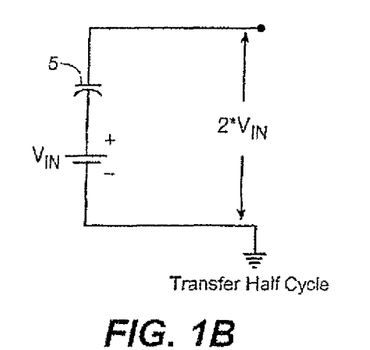
FIG. 1B is a simplified circuit diagram of the transfer half cycle in a generic charge pump.

Charge pumps use a combination of switches and capacitors to provide a DC output voltage higher or lower than its DC input voltage. To generate the required output, transfer of charge from input to output happens through capacitors and switches. During one clock half cycle, the charging half cycle, the capacitor couples in parallel to the input so as to charge up to the input voltage. During a second half cycle, the boost half cycle, the charged capacitor's bottom plate is boosted with the input voltage so as to provide an output voltage twice the level of the input voltage. This process is illustrated in FIGS. 1A and 1B. In FIG. 1A, the capacitor 5 is arranged in parallel with the input voltage $V_{IN}$ to illustrate the charging half cycle. In FIG. 1B, the charged capacitor 5 is arranged in series with the input voltage to illustrate the transfer half cycle. As seen in FIG. 1B, the positive terminal of the charged capacitor 5 will thus be $2*V_{IN}$ with respect to ground.

Charge pumps are used in many contexts. For example, they are used as peripheral circuits on flash and other non-volatile memories to generate many of the needed operating voltages, such as sensing, programming or erase voltages, from a lower power supply voltage. A number of charge pump designs, such as conventional Dickson-type pumps, are known in the art. But given the common reliance upon charge pumps, there is an on-going need for improvements in pump design, particularly with respect to trying to save on current consumption and reduce the amount ripple in the output of the pump.

SUMMARY

A charge pump system includes a first charge pump section connected to receive an input voltage and a clock signal and to generate from these an output voltage. The first charge pump section includes N capacitors, each having a first (or top) plate and a second (or bottom) plate and where N is an integer greater than or equal to three, and switching circuitry connected to receive the clock signal. According to the clock signal, the switching circuitry alternately connects the capacitors in a first phase, in which the first plate of each of the capacitors is connected to receive the input voltage and the second plate of each of the capacitors is connected to ground. And in a second phase, in which the capacitors are connected in series such that the second plate of the first capacitor in the series is connected to receive the input voltage, and for each capacitor after the first in the series the second plate is connected to the first plate of the preceding capacitor in the series and the first plate of the last capacitor in the series is connected to supply the output voltage of the first charge pump section. The switching circuitry includes: a first number of PMOS transistors connected in series between the first plate of the (M−1)st capacitor in the series and the second plate of the Mth capacitor in the series, where M is an integer between one and N; and a second number of PMOS transistors having control gates connected to the first plate of the (M−1)st capacitor in the series and that are connected in series between the first plate of the Mth capacitor in the series and the second plate of the (M+1)st capacitor in the series. The second number is larger than the first number and the PMOS transistors are low voltage devices that cannot support voltage differences greater than the input voltage.

Methods are presented of generating an output voltage. A plurality of N capacitors are provided, each having a first plate and a second plate, where N is an integer greater than or equal to three. The capacitors are alternately connected in a first phase and a second phase according to a first clock signal by switching circuitry. The first phase includes: connecting the first plates of the capacitors to receive an input voltage; and connecting the second plates to ground. The second phase includes: connecting the capacitors in series such that the second plate of the first capacitor in the series is connected to receive the input voltage, and for each capacitor after the first in the series the second plate is connected to the first plate of the preceding capacitor in the series; and supplying the output voltage of the charge pump from the first plate of the last capacitor in the series. The switching circuitry includes: a first number of PMOS transistors connected in series between the first plate of the (M−1)st capacitor in the series and the second plate of the Mth capacitor in the series, where M is an integer between one and N; and a second number of PMOS transistors having control gates connected to the first plate of the (M−1)st capacitor in the series and that are connected in series between the first plate of the Mth capacitor in the series and the second plate of the (M+1)st capacitor in the series, wherein the second number is larger than the first number and the PMOS transistors cannot support voltage differences greater than the input voltage.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Non-volatile memory devices, program, read and erase operations often require high voltages in the range of 10-20V. As on-chip supply levels are often of around 3V, for example, these high voltages are generated with the charge pump circuits. To support these high voltage levels, high voltage charge pump designs typically uses high voltage devices. These devices require large amounts of area and create high parasitics, which results in more drawing more device current ICC. The following presents a high voltage (HV) charge pump that uses low voltage devices (such as for the pump capacitors and transfer switches) and relatively few HV devices. This can significantly reduce the area requirements. Although can be applied more generally to integrated circuits that need to generate high voltages from a relatively low on-chip supply level, the following is largely presented in the context of non-volatile memory circuits when reference is made to a particular application.

Figure 2:
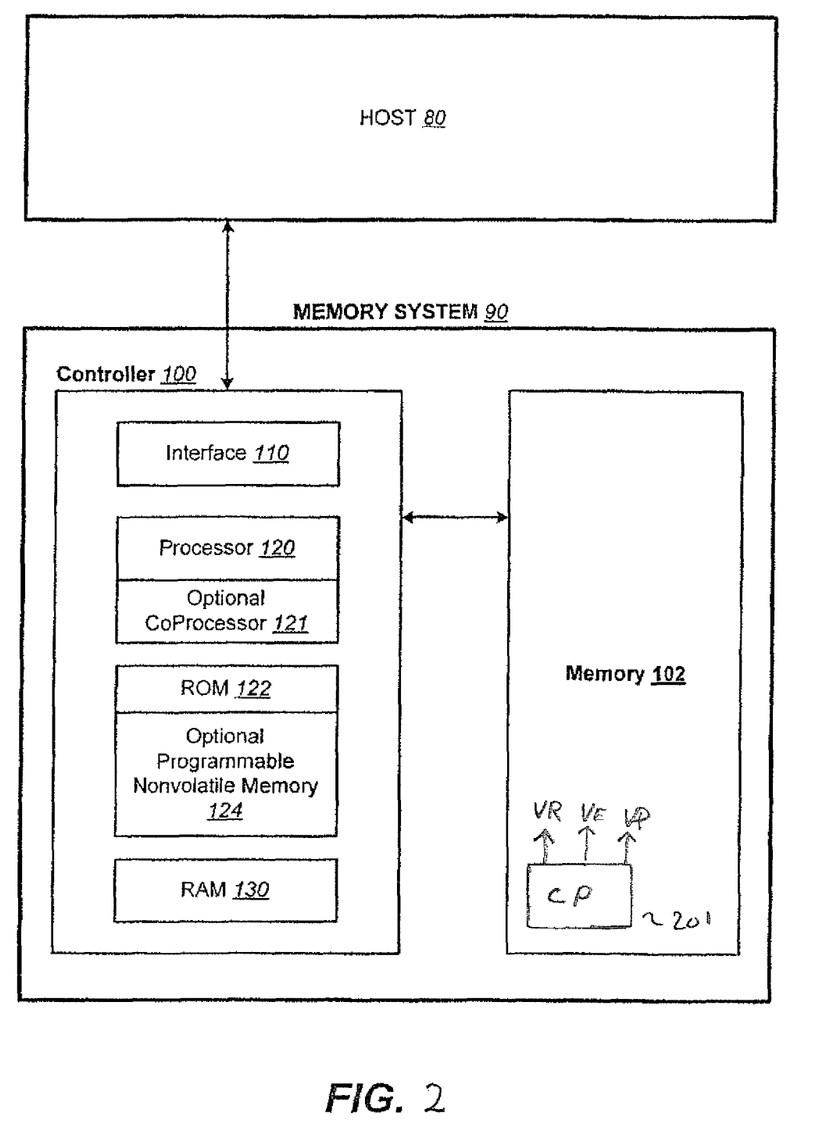
FIG. 2 is a schematic representation of a non-volatile memory system, in which charge pumps are commonly used.

FIG. 2 illustrates schematically the main hardware components of a memory system that includes an integrated non-volatile memory circuit such as that on which a charge pump might be used as a peripheral element for generating needed operating voltages. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip, which can include one or more charge pumps 201 as peripheral element to provide various voltages for read, write or erase operations (schematically represented as VR, VP, VE) that need values boosted above the on-ship supply level. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but cover all relevant memory structures within the spirit and scope as described herein. More detail on such memory devices and systems is given in U.S. patent application Ser. No. 14/528,711 filed on Oct. 30, 2014.

Figure 3A:
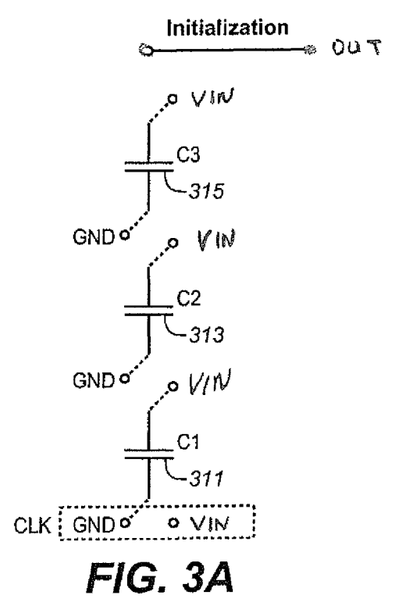
FIGS. 3A and 3B show the initialization and transfer modes of an exemplary charge pump topology.
Figure 3B:
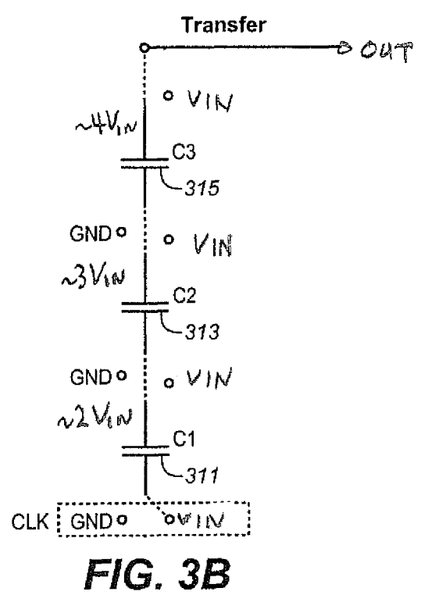

Returning to the specifics of charge pumps, any of the various charge pump types (Dickson, voltage doubler, four-phase) can be used in generating boosted voltage levels, but the exemplary embodiments described here uses the sort of topology illustrated with respect to FIGS. 3A and 3B. A number of capacitors (N, taken as N=3 for this discussion) are connected in series in the transfer phase or mode, while in the initialization phase or mode each capacitor is connected between the low voltage level (typically ground) and an input voltage VIN. Depending on the embodiment, the input voltage can be the on-chip supply level or a voltage from an earlier section of the charge pump system. In the example below, VIN is provided as the regulated output of an earlier charge pump section. In either case, the VIN level is used to control the pre-charge on each of the internal stage node.

FIGS. 3A and 3B respectively show the initialization phase and the transfer phase of the charge pump. The number of stages, N, shown in the examples is N=3, as this is convenient, but it will be understood that other numbers can be used as appropriate. For the initialization phase of FIG. 3A, the "bottom" plate of each capacitor (C1 311, C2 313 and C3 315) is set to 0V, while the "top" plate is reset to a level based on the section's input voltage VIN. The switches to effect this based on the clock signal CLK are only shown schematically and are discussed further below.

The second operating phase, or transfer phase, is shown is shown in FIG. 3B. The N stages are now connected in series between the VIN level and the output node to supply the output. For regulated operation, this output is also supplied to regulation circuitry. Ignoring any drops across the switches (again only indicated schematically) and assuming 100% efficiency in charge sharing, the level top plate of C1 is 2 VIN, the level on the top plate of C2 is 3 VIN, and the output level from the top plate of C3 will be 4 VIN. Consequently, even if the input level of VIN is just the on-chip supply level, avoiding a violation of electrical design rules (EDRs) will typically require the use of high voltage capacitors and high voltage switches for connecting these capacitors before too many stages; and if VIN is already boosted above Vdd, all of the capacitors and inter-capacitor switches will be high voltage (HV) devices to be able to support the stress between the device terminals under prior art designs.

Figure 4:
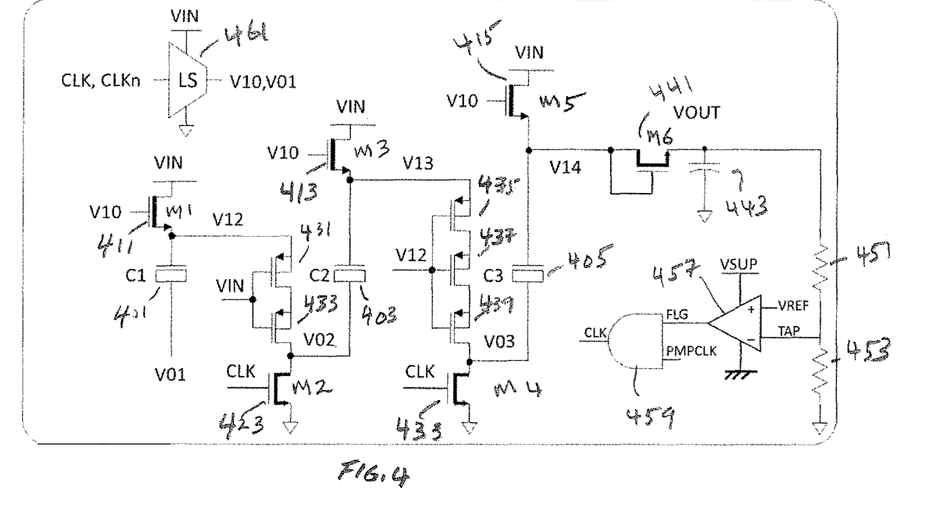
FIG. 4 includes the switches for the exemplary high voltage embodiment of the topology illustrated in FIGS. 3A and 3B.

HV devices require significantly more area than low voltage (LV) devices for given specifications. FIG. 4 presents an example of a high voltage pump that still can provide a high voltage output, but be realized with LV capacitors and LV switches connecting the capacitors, resulting in a much reduced area requirement. FIG. 4 uses the topology described with respect to FIGS. 3A and 3B, again for the example of three capacitors, but includes the switching circuity so that the circuit can operate as a HV charge pump while using low voltage devices to generate the high voltage. FIG. 4 shows only what would be a half-side of a typical implementation as there are usually two "legs' or "branches" to a pump section that are of similar design, but operated 180 degrees out of phase to help smooth the output.

The capacitors C1 401, C2 403, and C3 405 are each respectively has their upper plate connectable to the input voltage VIN through the transistors M1 411, M3 413, and M5 415. In this example, VIN is a regulated supply of, for example, ~4V or so, which would be around the design rule limit for the LV devices in this example. VIN can be generated from the on-chip supply level of, say 3~3.3V, from a preceding pump section of the system, such as described below with respect to FIG. 5. The switches M1 411, M3 413, and M5 415 are HV device have their gates connected to a boosted form of the clock signal V10. The lower plates of C2 403 and C3 405 are each respectively have their lower plate connectable to ground through the transistors M2 423 and M4 433, which are again HV devices and have their gates connected to receive the clock signal CLK. The lower plate of C1 401 receives the inverted form of the boosted clock signal V01. V10 and V01 can be generated from a level shifter LS 461 that can receive the clock signal CLK (and, if needed, its inverse CLKn) and that also receives VIN to generate V10 and V01 to respectively have the same phase CLK and CLKn, but with an amplitude of VIN. This allows the transistors M1 411, M3 413, and M5 415 to fully pass VIN and also alternately set the lower plate of C1 401 at ground in the initialization phase and at VIN for transfer.

During initialization phase of the first half cycle, each of the pump capacitors will be charged to VIN individually. During next half cycle, all low voltage pump capacitors are connected in series, so that Max(V12)=~2 VIN, Max(V13)=~3 VIN and Max(V14)=~4 VIN. More accurately, $$VOUT = 4VIN - \frac{I_L T}{2}\left(\frac{1}{C_1} + \frac{1}{C_2} + \frac{1}{C_3}\right).$$

where $I_L$ is load current, T is the CLK time period and $C_1$, $C_2$, $C_3$ are the respective stage pump capacitances. The voltage across the top plates/bottom plates of the pump capacitors increases as the number of stages increases. Due to this, to discharge bottom plates use HV devices (M2, M4), as well as for charging the top plate uses the HV devices (M1, M3, M5).

Transferring the charge between the stages will be done through the LV PMOS switches of the series connected pair 431 and 433 between C1 401 and C2 403; and series connected set of three 435, 437, and 439 between C2 403 and C3 405. The gates of 431 and 433 are connected to VIN, so that the source side of the pair is at VIN during initialization and these gates will be off, but then turn on when V01 goes high and the capacitors are connected in series. The three PMOS switches 435, 437, and 439 have their gates connected to V12 and will act similarly. During the charging phase, the V02 node charged to 0V and C1 is charged to VIN. During the transfer phase, when V01 goes high, V12 will go high (2 VIN); but as V02 is charging from 0V to 2 VIN, this will result in a somewhat smaller high voltage pulse due to parasitics. This pulse results in high voltage (HV) stress on PMOS device and to avoid this HV stress on source to drain and source to body the PMOS switches' bulk can connected to source terminal for 431, 433 and also for 435, 437, and 439. This will provide a distribution of the high voltage on the series connected LV PMOS devices, so that the devices can be used without violating EDR rules.

The final output VOUT will be connected to the V14 node through the low threshold voltage HV diode M6 441 to ensure proper charge transfer without having to rely upon non-overlapping clock signals between the pump legs (that is, the show half-side and the non-represented off-phase half-side). An output capacitor 443 can also be included.

The embodiment of FIG. 4 uses an ON/OFF sort of regulation, where the comparator 457 has a reference value VREF at its first input and its second input TAP is from a node of the voltage divider (here made up of the resistances 451 and 453) between VOUT and ground, but other arrangements can be used. Based on the inputs, the comparator 457 generates an output FLG. FLG and a pump clock PMPCLK serve as inputs to the AND gate 459: when FLG is asserted, the CLK signal is the same as PMPCLK and when FLG is de-asserted, CLK is flat. In other embodiments, different regulation schemes can be used such as varying the clock frequency (rather than a straight ON/OFF), varying the VIN amplitude, or both, based on feedback from the VOUT level.

Figure 5:
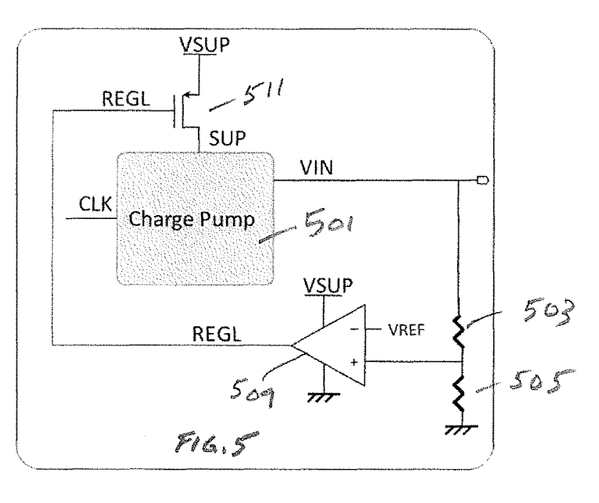
FIG. 5 is a schematic representation of a preceding section to provide the input voltage for the circuit of FIG. 4.

The exemplary embodiment of FIG. 4 uses a regulated input voltage VIN that has already been boosted from the on-chip supply level by a preceding section of the charge pump system. FIG. 5 is a schematic representation of such a section. A charge pump 501 receives a clock signal CLK (typically not the ON/OFF regulated clock of FIG. 4, but can be the same as PMPCLK) and an input voltage SUP to generate VIN. The pump 501 can be of the Dickson type, a voltage doubler, four-phase, or other type as selected for the particular device requirements. Any of the typical regulation schemes can be used. In this example, an operational amplifier 509 has a first input connect to receive a reference level VREF, which need not be the same as in FIG. 4, and a second input connected to a node of a voltage divider formed of resistances 503 and 505 connected in series between VIN and ground. The output REGL of operational amplifier 509 is used at the gate a transistor 511 between the on-chip supply level VSUP and the charge pump 501 to supply it with the regulated input level 501. (Here VSUP is a regulated on-chip supply level of around 2.3~2.5V, for example, derived from the chip supply of, say, 3-3.3V.)

Returning to FIG. 4, a number of variations and generalization are available. For example, rather than three stages, a two implementation can made by basically removing the elements between the nodes V13 and V14 so that V13 is, through the output diode M6, connected to provide VOUT. The number of stages can also be increased by one or more stages, each repeating the structure between V13 and V14, but with the number of serially connected inter-capacitor PMOS switches increased at each step and with their gates connected to the top plate of the preceding stage's capacitor: for example, in adding a fourth capacitor C4, four PMOSs would be between C3 305 and the added C4 with their control gates connected to receive V13.

With respect to the number of PMOS devices between each pair of capacitors in the sequence, the PMOS transistors are acting as switches during the series connection of capacitors and the switches are arranged such that the voltage drop across each switch Vgs (gate to source voltage) is same. This allows for the same strength of PMOS to be used at each level, with the number used stepped up as the voltage of each stage steps up; but, more generally, if desired some number of these devices could be replace with ones able to withstand higher voltages. For example, so sort of intermediate voltage device could be used to reduce the number of devices at each stage, but again at the cost of increasing layout area. To use LV devices, the potential difference across the devices will be below what is specified in the design rules for the chip, and allows the pump section to use LV capacitors for C1, C2, C3 because at any point of operation the voltage across them will not be over VIN.

The charge pump structures presented here maintain the voltage across the each pump capacitor, and each of the PMOS switches, at VIN. This helps to reduce any design rule (EDR) issue with using LV devices within the HV pump. The bottom plate to substrate (n-well-p-sub) junction of the pump capacitor and PMOS bulk to substrate (n-well-p-sub) should be designed to withstand the voltages (e.g., ~3 VIN for the bottom plate of C3) involved.

In the topology used here, the charge will be taken from the supply in first half cycle, and during the next half cycle, this charge is immediately placed in output which results in faster output ramp-up. Alternatively to meet same ramp-up specifications pump size can be reduced, resulting in area and ICC savings. As the design does not require using a boosted voltage on the gates between stages, as in common in other topologies, the additional circuitry needed to provide these boosted voltages is not needed, reducing relative area and ICC requirements. Additionally, relative to HV pump design that require cross connections between legs, such for voltage doubler arrangements, not have such signal cross connections reduces parasitic routing capacitances.

The foregoing detailed description has been presented for purposes of illustration and description. It is not intended to be exhaustive or to limit the above to the precise form disclosed. Many modifications and variations are possible in light of the above teaching. The described examples were chosen in order to explain the principals involved and its practical application, to thereby enable others to best utilize the various embodiments and with various modifications as are suited to the particular use contemplated. It is intended that the scope be defined by the claims appended hereto.

It is claimed:

1. A charge pump system, comprising:
    a first charge pump section connected to receive an input voltage and a first clock signal, including:

three or more capacitors, each capacitor having a first plate and a second plate; and switching circuitry connected to receive the first clock signal, whereby the capacitors are alternately connectable according to the first clock signal in a first phase and a second phase, wherein, in the first phase, the first plate of each of the capacitors is connected to receive the input voltage and the second plate of each of the capacitors is connected to ground, and wherein, in the second phase, the capacitors are connected in series such that the second plate of a first capacitor in the series is connected to receive the input voltage, and for each capacitor after the first capacitor in the series, the second plate is connected to the first plate of a preceding capacitor in the series, and the first plate of a last capacitor in the series is connected to supply an output voltage of the first charge pump section, wherein the switching circuitry comprises:

a first number of PMOS transistors connected in series between the first plate of the first capacitor in the series and the second plate of a second capacitor in the series, and a second number of PMOS transistors having control gates connected to the first plate of the first capacitor in the series, wherein the second number of PMOS transistors are connected in series between the first plate of the second capacitor and the second plate of a third capacitor in the series, wherein the second number is larger than the first number.

2. The charge pump system of claim 1, wherein control gates of the first number of PMOS transistors are connected to the input voltage.

3. The charge pump system of claim 1, wherein the three or more capacitors are configured for voltage differences substantially equal to and/or less than the input voltage.

4. The charge pump system of claim 1, further comprising an initial charge pump section configured to generate the input voltage as a regulated output level of a supply voltage.

5. The charge pump system of claim 1, wherein the switching circuitry is further configured to connect the first plates of the three or more capacitors to the input voltage when the first clock signal is high.

6. The charge pump system of claim 1, further comprising:

three or more switches, each of the three or more switches being connected between the first plate of a respective one of the three of more capacitors and the input voltage; and a level shifter configured to generate a boosted form of the first clock signal, wherein gates of the three or more switches are connected to receive the boosted form of the first clock signal.

7. The charge pump system of claim 1, wherein the second plate of the first capacitor in the series is connected to receive a boosted and inverted form of the first clock signal.

8. The charge pump system of claim 1, wherein the switching circuitry further comprises NMOS transistors configured to connect the second plate of the second capacitor in the series and the second plate of the third capacitor in the series to ground when the first clock signal is high.

9. The charge pump system of claim 1, further comprising:

regulation circuitry connected to generate the first clock signal from an input clock signal in response to a first clock enable signal, the regulation circuitry comprising:

a voltage divider circuit connected between the output voltage and ground; and an operational amplifier configured to generate the first clock enable signal, the operational amplifier having a first input connected to a reference voltage and a second input connected to a node of the voltage divider circuit.

10. The charge pump system of claim 1, further comprising:

a low threshold voltage diode connected to the first plate of the last capacitor in the series.

11. The charge pump system of claim 1, wherein the three or more capacitors and the switching circuitry comprise peripheral elements of a non-volatile memory circuit.

12. The charge pump system of claim 1, wherein the three or more capacitors and the switching circuit comprise peripheral circuitry of a non-volatile memory, the non-volatile memory comprising a monolithic three-dimensional semiconductor memory device having memory cells arranged in multiple physical levels.

13. A method, comprising:

alternately connecting N capacitors in a first phase and a second phase according to a first clock signal by use of switching circuitry, wherein each of the N capacitors comprises a first conductor and a second conductor, wherein N is an integer greater than two, and wherein connecting the N capacitors in the first phase includes:

connecting the first conductors of the N capacitors to receive an input voltage while the second conductors of the N capacitors are connected to ground, and wherein connecting the N capacitors in the second phase includes:

connecting the N capacitors in series from a first capacitor in the series to a last capacitor in the series, and supplying an output voltage from the first conductor of the last capacitor in the series, wherein connecting the N capacitors in series comprises:

connecting the first conductor of a (M−1)st capacitor in the series and the second plate of an Mth capacitor in the series through a first number of PMOS transistors, where M is an integer between two and N; and connecting the first plate of the Mth capacitor and the second plate of an (M+1)st capacitor in the series through a second number of PMOS transistors having control gates connected to the first plate of the (M−1)st capacitor, wherein the second number is larger than the first number.

14. The method of claim 13, wherein M is two and the first number of PMOS transistors have control gates connected to the input voltage.

15. The method of claim 13, wherein the N capacitors cannot support voltage differences greater than the input voltage, and wherein the PMOS transistors cannot support voltage differences greater than the input voltage.

16. The method of claim 13, further comprising generating the input voltage as a regulated output level of a supply voltage level.

17. The method of claim 13, further comprising generating the first clock signal from an input clock signal in response to a first clock enable signal.

18. The method of claim 13, further comprising supplying the output voltage through a low threshold voltage diode connected transistor configured for voltage differences greater than the input voltage.

19. The method of claim 13, further comprising using the output voltage in one or more of a programming operation, a sensing operation, and an erase operation on the non-volatile memory.

20. The method of claim 13, wherein the capacitors and the switching circuitry are embodied within a peripheral region of a non-volatile memory, the method further comprising using the output voltage in one or more of a write operation, a program operation, a sense operation, and an erase operation on the non-volatile memory.

21. The method of claim 13, wherein the capacitors and the switching circuitry are part of a non-volatile memory circuit, the method further comprising using the output voltage in one or more of a programming operation, an erase operation, and a sensing operation on non-volatile memory cells of the non-volatile memory circuit.

22. The method of claim 13, further comprising using the output voltage as an operating voltage for a monolithic three dimensional semiconductor memory device having memory cells arranged in multiple physical levels above a silicon substrate, each memory cell including a charge storage medium.

* * * * *